United States Patent
Van Den Brink et al.

(10) Patent No.: US 6,438,404 B1
(45) Date of Patent: Aug. 20, 2002

(54) MAGNETIC RESONANCE METHOD AND DEVICE FOR MEASURING A PERIODICALLY VARYING FLUID FLOW IN AN OBJECT

(75) Inventors: Johan S. Van Den Brink; Peter Van Der Meulen, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/442,961

(22) Filed: Nov. 18, 1999

(30) Foreign Application Priority Data

Nov. 18, 1998 (EP) .............................. 98203883

(51) Int. Cl.$^7$ ............................................... A61B 5/055
(52) U.S. Cl. .................. 600/419; 324/306; 324/309
(58) Field of Search ................. 600/410, 419; 324/306, 307, 309

(56) References Cited

U.S. PATENT DOCUMENTS 4,110,680 A * 8/1978 Bergmann et al. .......... 324/309
5,221,898 A * 6/1993 Takiguchi et al. .......... 324/306
5,900,731 A * 5/1999 Henkelmann et al. ...... 324/306

OTHER PUBLICATIONS

"Discrimination of Different Types of Motion by Modified Stimulated-Echo NMR" by J.E.M. Snaar and H. Van As in Journal of Magnetic Resonance, 87(1990) Mar., No. 1, Duluth, MN, US., pp. 132–140.

* cited by examiner

Primary Examiner—Ruth S. Smith

(57) ABSTRACT

The invention relates to a method for in vivo measurement of a periodically varying fluid flow in an object by means of magnetic resonance. The method includes a step for applying first and second additional magnetic field gradients in order to shift the phase of a reference magnetization, which phase shift relates to a net flow of the fluid during an interval between the application of the additional magnetic field gradients. According to the invention, near a phase of a period of the periodically varying fluid flow an excitation RF pulse is generated, the first additional gradient is applied and a first additional RF pulse is generated and near a corresponding phase of a second period of the periodically varying fluid flow a second additional RF pulse is generated and the second additional gradient is applied.

8 Claims, 4 Drawing Sheets

MAGNETIC RESONANCE METHOD AND DEVICE FOR MEASURING A PERIODICALLY VARYING FLUID FLOW IN AN OBJECT

BACKGROUND OF THE INVENTION

1. Field of the Invention

The invention relates to a method of measuring a periodically varying fluid flow in an object by means of magnetic resonance, which object is arranged in a steady magnetic field, said method including the following steps:
generating an excitation RF pulse in order to direct a reference magnetization in a plane extending transversely of the direction of the steady magnetic field,
applying a first additional gradient in a flow direction of the fluid flow in order to produce a phase shift in the reference magnetization,
generating a first additional RF pulse in order to direct the reference magnetization in the direction of the steady magnetic field,
generating a second additional RF pulse in order to direct a part of the reference magnetization in a transverse direction relative to the direction of the steady magnetic
applying a second additional gradient in the flow direction in order to cancel the phase shift caused by the first additional gradient in static material near the fluid flow, measuring a first MR signal, and
determining a displacement of the fluid from the measured first MR signal and a reference MR signal measured in advance. The invention also relates to a device for carrying out such a method.

2. Description of the Related Art

A method of the described kind is known from the article "Discrimination of 2 Different Types of Motion by Modified Stimulated-echo NMR", published by J. E .M. Snaar et al. in Journal of Magnetic Resonance 87, pp. 132–140, 1990. The known method can be used, for example for in vivo measurement of the fluid flow of cerebral spinal fluid (CSF) in the brain of a human or animal to be examined. The production of CSF in the brain can be determined on the basis of the displacement of the CSF in for example the aqueduct of Sylvius in the brain. Deviations between the actual production of CSF and predetermined standard values may constitute an aid in diagnosing given neural degenerative diseases, for example Alzheimer's disease. According to the known method the excitation RF pulse is generated in conjunction with the application of a gradient which is directed in a first direction in order to excite spins in the volume of a fluid flow. In order to realize a motion-induced phase shift in the first MR signal to be measured, after the generating of the excitation RF pulse a gradient pair is applied and subsequently the first additional RF pulse is generated. The net displacement of the fluid flow can then be determined from the phase of the measured first MR signal and the phase of the reference MR signal measured in advance.

It is a drawback of the known method that a measurement of the net displacement of the fluid flow is inaccurate because of a large periodic component in the fluid flow which is due to the periodically varying blood pressure.

Citation of a reference herein, or throughout this specification, is not to construed as an admission that such reference is prior art to the Applicant's invention of the invention subsequently claimed.

SUMMARY OF THE INVENTION

It is an object of the invention to provide a method offering improved measurement of the net displacement of the periodically varying fluid flow. To achieve this, the method according to the invention is characterized in that near a phase of a first period of the periodically varying fluid flow the excitation RF pulse is generated, the first additional gradient is applied and the first additional RF pulse is generated, and that near a corresponding phase of a second period of the periodically varying fluid flow the second additional RF pulse is generated, the second additional gradient is applied and the first MR signal is measured. The principle of the invention is as follows: a reference is created by means of the generated magnetization of a measuring volume of the periodically varying fluid flow near the phase of the first period of the periodically varying fluid flow in a first position in an examination space; this magnetization is directed along the first axis and near the corresponding phase of the second period, in the same position in the examination space, a part of this magnetization of the measuring volume is used to generate the first MR signal. The measured first MR signal then contains information concerning the net displacement of the fluid flow in the interval between the corresponding phases of the first and the second period. The first MR signal and the generated reference then contain information as regards the net displacement of the measuring volume in the fluid flow. An example of such a reference is the marking of the magnetization directed in the transverse plane by realization of a phase shift.

A special version of the method according to the invention is characterized in that the first phase of the period of the periodic fluid flow corresponds to a zero-crossing of a flow velocity of the periodic fluid flow. The error in the phase shift which is due to the flow velocity is minimized by application of the first and the second additional gradients near the zero crossings of the first and the second periods.

A further version of the method according to the invention comprises determining the reference MR signal by performing, near a corresponding phase of a further third period of the periodically varying fluid flow, generating the excitation RF pulse, applying the first additional gradient, and generating the first additional RF pulse, and near a corresponding phase of a further fourth period of the periodically varying fluid flow, generating the second additional RF pulse, applying the second additional gradient, and measuring the reference MR signal, wherein a time integral of the first additional gradient applied in the third period is different from a corresponding time integral of the first additional gradient applied in the first period. The reference MR signal can be simply determined by repetition of the same pulse sequence.

A further version of the method according to the invention comprises determining the reference MR signal by generating a third additional RF pulse near a corresponding phase of a next period of the periodic fluid flow, applying a third additional gradient which has the same properties as the second additional gradient, and measuring the reference MR signal. The measurement of the first MR signal and the reference MR signal is thus integrated in one pulse sequence. A net displacement of the periodically varying fluid flow can thus be determined from only three successive zero crossings.

Another version of the method according to the invention in which the fluid flow varies with a period which corresponds to a period of a cardiac cycle of a human or animal to be examined, comprises measuring an ECG of the human or animal to be examined, and determining a reference from the measured ECG which corresponds to a phase in the period of the periodically varying fluid flow. The phases of the periods of the periodic fluid flow can be derived from the electrocardiogram (ECG), for example by determining the reference from the occurrence of an R-wave in the ECG and the phase in the period of the periodic fluid flow.

Another version of the method according to the invention comprising determining a zero crossing of the flow velocity of the periodically varying fluid flow by measurement of a flow velocity of the periodically varying fluid flow, wherein the reference also corresponds to the zero crossing of the flow velocity of the periodically varying fluid flow A known phase contrast MR angiography method is an example of a flow velocity measurement by means of magnetic resonance. This method is known, for example from the handbook "Magnetic Resonance Imaging", published by M. T. Vlaardingerbroek, Springer-Verlag, pp. 294–295.

In another embodiment of the method according to the invention a gradient pair for measuring a fluid flow can thus be combined with a gradient for measuring the MR signal. Therefore, the invention also relates to a method of forming a two-dimensional velocity profile of a periodically varying fluid flow in an object which is arranged in a steady magnetic field, which method includes the following steps:

a) generating an excitation RF pulse in order to direct a reference magnetization in a transverse plane relative to the direction of the steady magnetic field,
b) applying a first additional gradient in a flow direction of the fluid flow in order to induce a phase shift in the reference magnetization,
c) generating a first additional RF pulse in order to direct the reference magnetization in the direction of the steady magnetic field,
d) generating a second additional RF pulse in order to direct a part of the reference magnetization in a transverse direction relative to the direction of the steady magnetic field,
e) applying a second additional gradient in the flow direction in order to cancel the phase shift caused by the first additional gradient in static material near the fluid flow,
f) measuring first MR signals, and
g) determining a phase image from the measured first MR signals and determining the two-dimensional velocity profile of the fluid from the phase image and a reference phase image.

This latter method according to the invention is characterized in that near a phase of a first period of the periodically varying fluid flow the excitation RF pulse is generated, the first additional gradient is applied and the first additional RF pulse is generated, and that near a corresponding phase of a second period of the periodically varying fluid flow the second additional RF pulse is generated, the second additional gradient is applied and the first MR signal is measured.

The invention also relates to a device for carrying out such a method. A device of this kind comprises means for sustaining a steady magnetic field, means for applying gradients, means for generating RF pulses to be applied to the object to be examined in the steady magnetic field, a control unit for controlling the application of gradients and the generating of RF pulses, and means for receiving and sampling magnetic resonance signals which are generated by pulse sequences containing the RF pulses and the gradients, wherein said control unit is arranged to generate an excitation RF pulse in order to direct a reference magnetization into a plane which extends transversely of the direction of the steady magnetic field, apply a first additional magnetic field gradient in a flow direction of the fluid flow in order to produce a phase shift in the reference magnetization, generate a first additional RF pulse in order to direct the reference magnetization into the direction of the steady magnetic field, generate a second additional RF pulse in order to direct a part of the reference magnetization into a transverse direction relative to the direction of the steady magnetic field, apply a second additional magnetic field gradient in the flow direction in order to cancel the phase shift caused by the first additional gradient, measure a first MR signal, and determine a displacement of the fluid from the measured first MR signal and a reference signal, wherein the control unit is further arranged so that, near a phase of a first period of the periodically varying fluid flow, the excitation RF pulse is generated, the first additional gradient is applied and the first additional RF pulse is generated, and, near a corresponding phase of a second period of the periodically varying fluid flow, the second additional RF pulse is generated, the second additional gradient is applied and the first MR signal is measured

BRIEF DESCRIPTION OF THE DRAWING

These and other aspects of the invention are apparent from and will be elucidated, by way of non-limitative example, with reference to the embodiments described hereinafter and the accompanying drawings. Therein.

DETAILED DESCRIPTION OF THE PREFERRED EMBODIMENT

Figure 1:
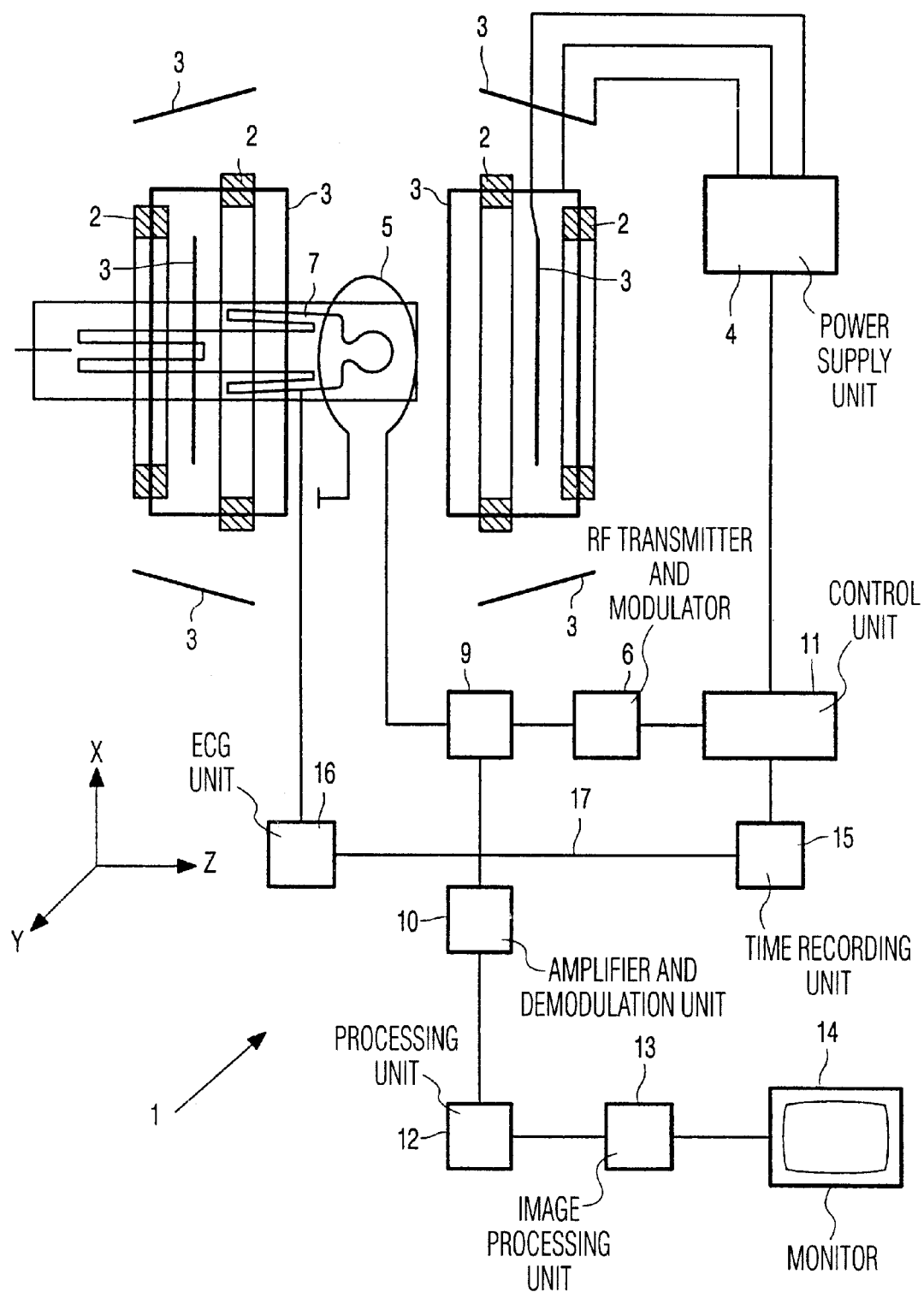
FIG. 1 shows a magnetic resonance imaging device.

FIG. 1 shows a magnetic resonance imaging device which includes a first magnet system 2 for generating a steady magnetic field and also various gradient coils 3 for generating additional magnetic fields which are superposed on the steady magnetic field and cause a gradient in the steady magnetic field in three respective orthogonal directions of a co-ordinate system X, Y, Z. The Z direction of the co-ordinate system shown corresponds by convention to the direction of the steady magnetic field in the magnet system 2. A measuring co-ordinate system x, y, z to be used (not shown) may be chosen independently of the X, Y, Z co-ordinate system shown in FIG. 1. Generally speaking, a gradient in the x direction is referred to as a read-out gradient, a gradient in the y direction as a phase encoding gradient and a gradient in the z direction as a selection gradient. The gradient coils 3 are fed by a supply unit 4. The MR device also includes an RF transmitter coil 5. The RF transmitter coil 5 serves to generate RF magnetic fields and is connected to an RF transmitter and modulator 6. A receiver coil is used to receive the magnetic resonance signal generated by the RF field in the object 7 or a part of the object to be examined in vivo, for example a human or animal body. This coil may be the same coil as the RF transmitter coil 5. Furthermore, the magnet system 2 encloses an examination space which is large enough to accommodate a part of the body 7 to be examined. The RF transmitter coil 5 is arranged on or around a part of the body 7 in the examination space. The RF transmitter coil 5 is connected to a signal amplifier and demodulation unit 10 via a transmitter/receiver circuit 9. The control unit 11 controls the RF transmitter and modulator 6 and the power supply unit 4 in order to generate special MR imaging pulse sequences which contain RF pulses and gradients. The phase and amplitude derived from the demodulation unit 10 are applied to a processing unit 12. The processing unit 12 processes these signal values so as to form an MR image, for example by means of a two-dimensional Fourier transformation. An image processing unit 13 visualizes the MR image via a monitor 14. The MR device 1 also includes a time recording unit 15 and an ECG unit 16. The ECG unit 16 records an ECG of the object to be examined and determines the occurrence of an R-wave from the recorded ECG. The ECG unit 16 is connected to the time recording unit 15. The occurrence of the R-wave is signalled to the time recording unit by way of an electric signal. The time recording unit 15 records intervals between the occurrence of R-waves and the application of the gradients. The invention will be described in detail hereinafter with reference to the FIGS. 2 and 3. The invention can be used, for example as an aid for making a diagnosis of neuro-degenerative diseases. One property of a neuro-degenerative disease is that probably less CSF (cerebral spinal fluid) is produced in the brain. The newly produced CSF is displaced from the brain of the body to be examined to its central nerve system via a small tube, being referred to as the aqueduct of Sylvius. Because of the periodically pulsating blood flow, a strong pulse-shaped and periodic flow of the CSF occurs in said narrow tube. The newly produced CSF can be determined, for example from the net displacement of this fluid flow. A deviation between the production of new CSF and predetermined standard values may constitute an aid in making a diagnosis of neuro-degenerative diseases.

Figure 2:
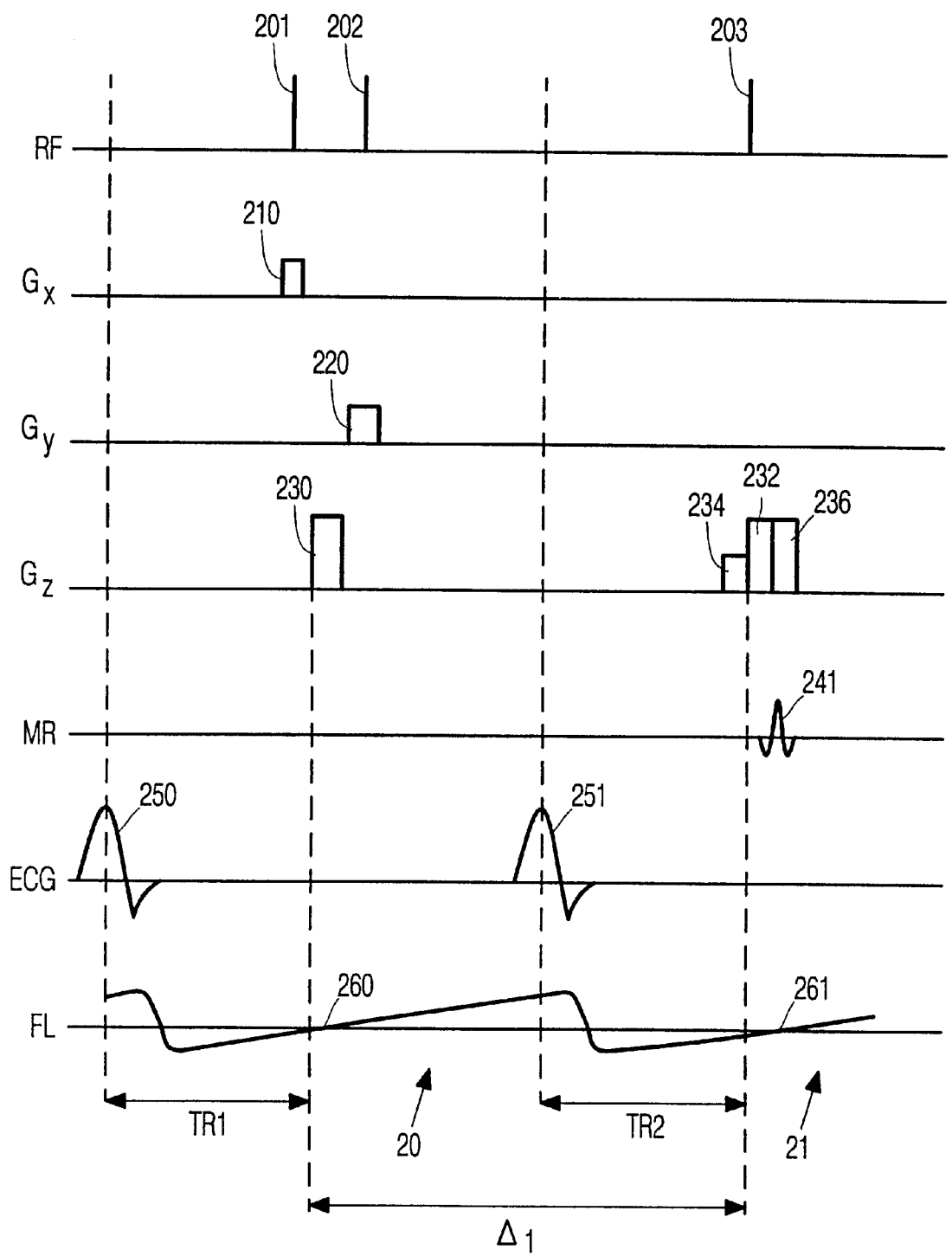
FIG. 2 shows an example of a first pulse sequence according to the invention.

FIG. 2 shows an example of a first pulse sequence which, in a first version of the method according to the invention, is used to measure a periodically varying fluid flow in vivo in the body to be examined, for example said CSF flow in the aqueduct of Sylvius in the brain of the body to be examined. In FIG. 2, like in FIG. 3, the time is plotted from left to right and the various rows indicate the temporal relationship between the RF pulses to be generated, the gradients to be applied, the MR signals to be measured, the periods occurring in an ECG of the body to be measured, and the periods in the periodically varying CSF flow. The upper row, denoted by the reference RF, shows the RF pulses to be generated; the three rows therebelow, denoted by the references $G_x$, $G_y$, $G_z$, show the gradients in the x, y and z directions, respectively. The row situated therebelow, denoted by the reference MR, shows the MR signals to be measured. Furthermore, the two lowermost rows, denoted by the references ECG and FL, show two periods of an ECG to be formed for the body to be examined and the velocity of the varying fluid flow. The periods of the ECG correspond to the periods of the periodically varying CSF flow in the aqueduct of Sylvius. It is to be noted that the ECG of the body to be examined is measured in a manner which is well known to those skilled in the art.

It appears that in the fluid flow in the aqueduct of Sylvius a pulse-shaped and periodic component of the CSF flow dominates a net displacement of the CSF. In order to measure the net displacement of the CSF flow, a first pulse sequence is generated. The first pulse sequence contains an excitation RF pulse 201, first and second additional RF pulses 202, 203, first and second additional gradients 230, 232, selection gradients 210, 220 and read-out gradients 236. After the appearance of an R-wave of the ECG to be recorded, the pulse sequence commences by generating the excitation RF pulse 201, applying a first gradient 210 in the x direction, applying the first additional gradient 230 and generating a first additional RF pulse 202, the first additional gradient being applied after a first trigger period TR1. The first trigger period TR1 determines a phase in a first period 20 of the periodic CSF flow, for example a first zero crossing 260 of the flow velocity in the periodic fluid flow. The angle of rotation α of the excitation RF pulse 201 amounts to, for example 90 degrees. The excitation RF pulse 201 rotates the magnetization of a measuring volume in the CSF flow through 90° about an y' axis of a rotating reference system in the transverse plane relative to the direction of the steady magnetic field. Subsequently, the first additional gradient 230 is applied; this gradient is directed in a flow direction of the periodically varying CSF flow in order to mark the transverse magnetization by way of a phase shift. In the present example the z direction of the co-ordinate system is chosen to be coincident with the flow direction of the CSF flow. The phase shift produced in the transverse magnetization then amounts to:

$$\varphi = \frac{1}{2}\gamma G v \delta^2 \tag{1}$$

in which
    φ represents the phase,
    γ represents a gyromagnetic constant,
    G represents the magnitude of the additional gradient,
    v represents an instantaneous flow velocity in the flow direction, and
    δ represents the interval in which the additional gradient is applied.

Subsequently, the first additional RF pulse 202 is generated. The first additional RF pulse also has an angle of rotation of 90 degrees about the y' axis of the rotating reference system. This first additional RF pulse rotates the marked magnetization in the direction of the steady magnetic field again. The marked magnetization thus becomes insensitive to a phase shift due to a motion during the interval in which the gradients are applied. Subsequently, after a second trigger interval TR2 after the appearance of the second R wave 251 in the measured ECG a second additional RF pulse 203 is generated near a corresponding phase in a second period 21 of the ECG which succeeds the first period in time, near a second zero crossing 261, in the flow velocity. This second additional RF pulse has an angle of rotation of 90° about the y' axis. Simultaneously with the generating of the second additional RF pulse 203 there is applied a third gradient 234 which is directed in the z direction in order to render the second additional RF pulse 204 spatially selective. The second additional RF pulse 204 rotates the marked magnetization in the transverse plane again. Immediately after the generating of the second additional RF pulse 203 there is applied a second additional gradient 232 which is directed in the flow direction of the CSF flow, so in this case in the z direction. This second additional gradient cancels the marking of the marked transverse magnetization by canceling the phase shift made during the first period 20 by applying an equally large but opposed phase shift. Furthermore, the time integral of the applied first additional gradient 230 is preferably equal to the time integral of the second additional gradient 232. Furthermore, a preparation read-out gradient 230 is preferably applied between the excitation RF pulse 201 and the first additional RF pulse 202 and a first MR signal 241 is measured during the application of a read-out gradient 236. The net displacement of the CSF in the aqueduct of Sylvius can be derived from the phase difference between the measured first MR signal 241, a reference MR signal and the applied additional gradients 230, 232. The reference MR signal can be determined, for example by repeating the experiment described with reference to FIG. 2 in a third and a fourth period, respectively, a time integral of the first additional gradient then being different from a corresponding time integral of the first additional gradient 230 in the first period and the reference MR signal being measured during the fourth period. The value zero is an example of a value of the time integral of the first and the second additional gradients applied during the second experiment. Another value of the additional gradients, for example equals the negative value of the time integral of the additional gradients 230, 232 applied during the first experiment.

Instead of being measured afterwards, the reference MR signal can also be measured prior to the actual experiment. A phase contrast MR angiography method is preferably used to determine the intervals TR1, TR2 between the respective zero crossings 260, 261 in the flow velocity relative to the R waves 250, 251 of the recorded ECG of the human or animal to be examined. This method is known, for example from the cited handbook "Magnetic Resonance Imaging", published by M. T. Vlaardingerbroek, Springer Verlag, pp. 294–295.

Furthermore, the interval in which the first or the second additional gradient 230, 232 is applied is preferably chosen to be short in comparison with the duration of the fixed period of the varying fluid flow. The value of the interval δ is chosen so that the condition $$\delta^2 \ll \frac{v}{\gamma G} \cdot 2\pi \quad (2)$$

is satisfied;
therein:
  δ represents the interval in which the first or the second additional gradient is applied,
  v represents the instantaneous flow velocity,
  G represents the magnitude of the applied gradient, and
  γ represents the gyromagnetic constant.

A practical value for δ is, for example 5 ms. Furthermore, a measuring phase of the fixed period of the periodically varying CSF at which the first MR signal is measured is preferably chosen to be equal to a reference phase of the fixed period at which the reference MR signal is measured. The measuring phase in FIG. 2 corresponds to the second zero crossing 261 in the first period 20 and the reference phase corresponds to the third zero crossing in the fourth period (not shown). The velocity of the fluid during the two successive measurements can then be determined from the measured first MR signal and the reference MR signal by applying the formula:

$$\Delta\phi = \gamma v_{netto} \delta (G_2 \Delta_2 - G_1 \Delta_1) \quad (3)$$

in which
  Δφ represents the phase difference between the phase associated with the maximum of the measured MR signal and the phase of the maximum of the reference MR signal measured in advance,
  γ represents a gyromagnetic constant,
  $v_{netto}$ represents the velocity of the CSF flow,
  $\Delta_1$ represents the measuring interval between the application of the first and the second additional gradients in the first measurement,
  $\Delta_2$ represents the measuring interval between the application of the first and the second additional gradients in the second measurement, and δ represents the interval in which the additional gradient is applied. In order to measure a velocity amounting to, for example approximately ¼ mm per second, the above values are chosen, for example as follows:
  δ=5 ms,
  $G_1$=20 mT/m,
  $G_2$=0.

Furthermore, it is important to measure the interval Δ between the application of the successive additional gradients accurately. To this end, for example the control unit 11 is provided with a time recording unit 15 which records the time interval between an R wave 250, 251 of the recorded ECG, originating from the ECG unit 16, and the instant at which the first and second additional gradients 230, 232 are applied during successive periods. The recorded interval is stored in, for example a solid state memory. The interval Δ between corresponding phases in corresponding periods of the periodically varying CSF flow amounts to approximately 1 second in practice.

In order to determine a projection of the magnetization in the CSF flow in a read-out direction, moreover a compensation read-out gradient can be applied between the excitation RF pulse 201 and the first additional RF pulse 202, a measuring gradient 236 being applied in order to measure the first MR signal 241. Furthermore, in order to reduce the measuring time required to execute such a projection the compensation read-out gradient can be combined with the first additional gradient 230, the first part of the read-out gradient 236 being combined with the second additional gradient 232.

In order to ensure that measurement takes place only if said interval Δ between the application of the additional gradients has approximately said values, for example arrhythmia rejection can be used. Arrhythmia rejection is a well-known phenomenon in MR angiography. In the case of arrhythmia rejection, the measured MR signals are used for further processing exclusively if the intervals between successive R waves of the measured ECG are substantially equal.

In another version of the method, for example the first and the second additional RF pulse 202, 204 can also be generated so as to have an angle of rotation amounting to 180 degrees.

Figure 3:
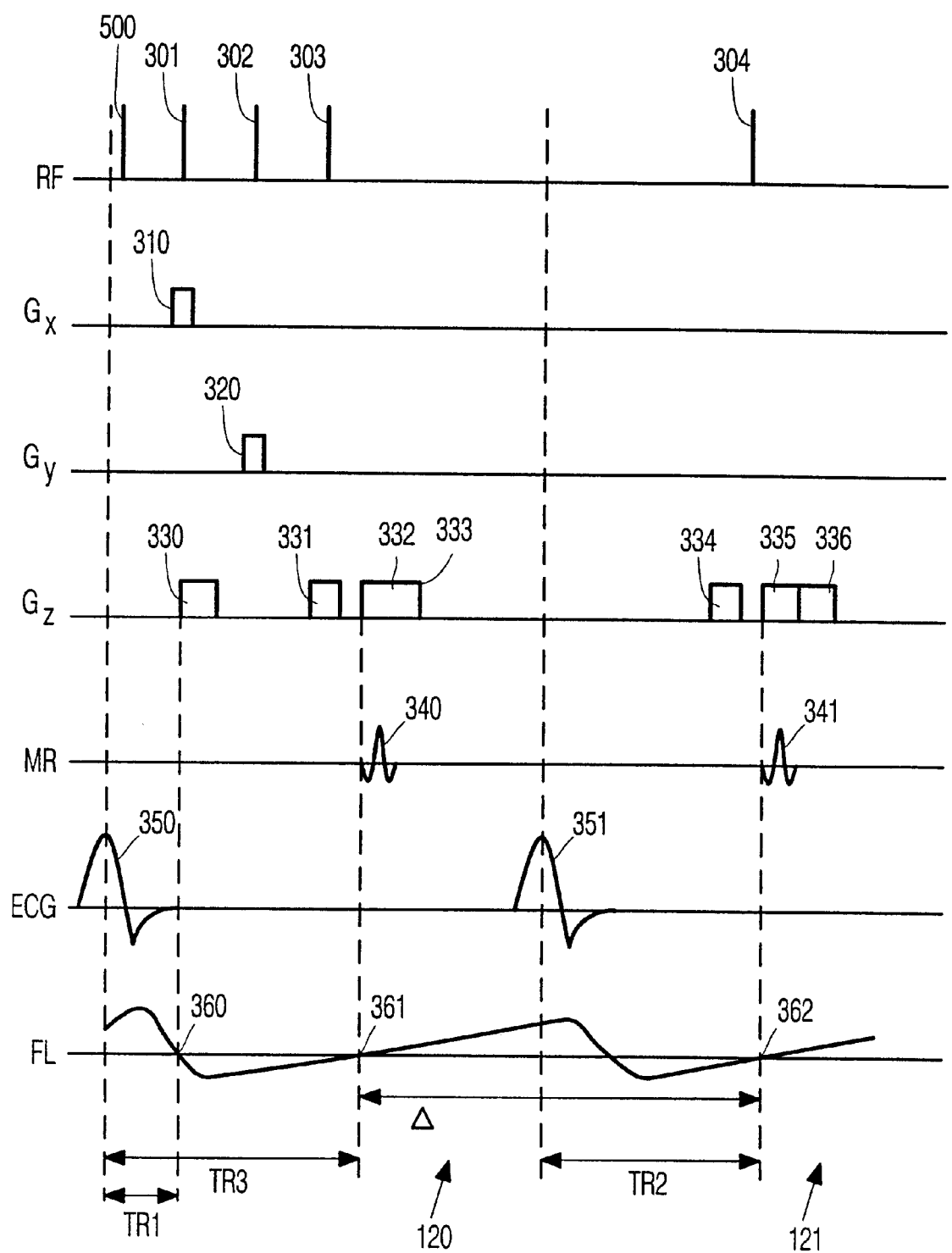
FIG. 3 shows an example of a second pulse sequence according to the invention.

FIG. 3 shows an example of a second pulse sequence which is used in a second version of the method according to the invention, for example in order to measure in vivo the periodically varying CSF flow in the aqueduct of Sylvius in the body to be examined. The first MR signal as well as the reference MR signal is measured by means of this second pulse sequence. The upper row in FIG. 3, marked by the reference RF, shows the RF pulses to be generated; the three rows situated therebelow, marked by the references $G_x$, $G_y$, $G_z$, show the gradients in the x, y and z directions, respectively. The row situated therebelow, denoted by the reference MR, shows the MR signals to be measured. Furthermore, the two lowermost rows, denoted by the references ECG and FL, show a number of periods of an ECG to be recorded for the body to be examined and the velocity of the varying fluid flow as a function of the heart beat. The second pulse sequence contains an excitation RF pulse 301, additional RF pulses 301, 302, 303, additional gradients 330, 331, 334, selection gradients 310, 320 and read-out gradients 333, 336. After the occurrence of an R wave of the ECG to be recorded, the pulse sequence commences by generating the excitation RF pulse 301, applying a first gradient 310 in the x direction, applying the first additional gradient 330, and generating the first additional RF pulse 302, the first additional gradient 330 being applied after a first trigger period TR1. The first trigger period TR1 determines a phase in a first period, 120 of the periodic CSF flow, preferably a first zero crossing 360 of the flow velocity in the periodic fluid flow. The angle of rotation α of the excitation RF pulse 301 amounts to, for example 90 degrees. The excitation RF pulse 301 rotates the magnetization of a measuring volume in the CSF flow through 90° about an y' axis of a rotating reference system in the transverse plane relative to the direction of the steady magnetic field. Subsequently, there is applied the first additional gradient 330 which is directed in a flow direction of the periodically varying CSF flow in order to mark the transverse magnetization by way of a phase shift. In the present example, the z direction of the co-ordinate system is to be chosen to be coincident with the flow direction of the CSF flow. Subsequently, a phase encoding is induced in the magnetization by application of the first additional gradient 330 during the first zero crossing 360, said first additional gradient 330 being directed in the z direction. The first additional RF pulse 302 directs the magnetization of the fluid flow in the direction of the steady magnetic field. The first additional RF pulse 302 preferably has an angle of rotation ot amounting to 90 degrees. Subsequently, two further additional RF pulses are generated, i.e. the second additional RF pulse 303 in the first period 120 and the third additional RF pulse 304 in the second period 121. The angle of rotation of the second and the third additional RF pulse preferably amounts to 10 degrees, thus ensuring that a part of the magnetization present in the z direction is sustained. The second additional RF pulse 303 directs a first part of the magnetization in the transverse plane again. Subsequently, during the second zero crossing 361 there is applied the second additional gradient 332 which has the same properties as the first additional gradient 330. The first part of the reference magnetization is rephased by way of the second additional gradient 331, after which a first MR signal 340 can be measured. The third additional RF pulse 304 directs a second part of the remaining reference magnetization in the transverse plane. Subsequently, during the third zero crossing 362 there is applied the third additional gradient 334 which has the same properties as the first additional gradient, after which a reference MR signal 341 can be measured.

The first, the second and the third zero crossing 360, 361, 362 are determined by determining, prior to the experiment, the intervals TR1, TR2, TR3, respectively, between the occurrence of R waves 350, 351 in the ECG signal of the body to be examined and the respective zero crossings 360, 361, 362 in the flow velocity of the CSF flow, the flow velocity being measured by means of the previously mentioned phase contrast MR method. For example, in FIG. 3 it is assumed that two zero crossings occur during a single period of the periodically varying CSF flow. Thus, two stimulated echo MR signals 340, 341 are measured. The displacement can be determined from the difference between the measured phases of the maxima of the reference MR signal 340 and the first MR signal 341 by means of the formule:

$$\Delta\phi_{flow} = \gamma G v \delta_1 \Delta_1 \quad (4)$$

in which $\Delta\phi_{flow}$ represents the phase difference between the phase associated with the maximum of the measured MR signal and the phase of the maximum of the reference MR signal measured in advance, γ represents a gyromagnetic constant, G represents the strength of the additional gradient in a first pulse sequence for measuring the first MR signal, v represents the net displacement of the CSF flow, δ represents the interval in which the additional gradient is applied, and Δ represents the interval between the application of the second and third additional gradients.

In order to measure the net displacement of a periodically varying CSF flow in the aqueduct of Sylvius, where the flow velocity amounts to approximately ¼ mm per second, the above parameters are chosen as follows:

δ=5 ms,

G=20 mT/m.

The interval A between successive periods normally amounts to approximately 1 second. In order to render the excitation RF pulse 301 and the first, the second and the third additional RF pulses 302, 303, 304 spatially selective, gradients 310, 320, 331 are applied during the generating of these RF pulses so that, for example a volume containing the aqueduct of Sylvius is selected. A first gradient 310 is applied in the x direction upon generation of the excitation RF pulse 301. Upon generation of the first additional RF pulse 302 a second gradient 320 is applied in the y direction and a third gradient 331 and a fourth gradient 334 are applied in the z direction upon generation of the second and the third additional RF pulse 304, 303.

Furthermore, a measuring phase of the fixed period of the periodically varying CSF flow at which the first MR signal is measured is preferably chosen to be the same as a reference phase of the fixed period at which the reference MR signal is measured. The measuring phase in FIG. 3 corresponds to the second zero crossing 361 in the first period 20 and the reference phase corresponds to the third zero crossing 362 in the second period 21.

In order to determine a projection of the magnetization in the CSF flow in a read-out direction, a compensation read-out gradient 330 is applied between the excitation RF pulse 301 and the first additional RF pulse 302 and a read-out gradient 336 is applied so as to measure the first MR signal 340. In order to measure the first MR signal 340 wherefrom the projection of the magnetization of the CSF flow in the flow direction can be derived, the compensation read-out gradient 330 is preferably combined with the first additional gradient 330 and the first part of a first read-out gradient 336 is combined with the second additional gradient 335. In order to determine the reference MR signal 341 wherefrom the projection of the magnetization of the CSF flow in the flow direction can be derived, the compensation read-out gradient 330 is preferably combined with the first additional gradient 330 and the first part of a second read-out gradient 335 is combined with the second additional gradient 336.

In order to ensure that adequate longitudinal magnetization always exists for the measurement of the first MR signal, the interval between successive ECG periods can be reduced by accelerating the heart beat of the body in a manner which is known to those skilled in the art.

In order to suppress background signals in the measured reference MR signal 340 and the measured first MR signal 341, a pre-RF pulse 500 can be generated prior to the excitation RF pulse 301. Such a pre-RF pulse 500 contains, for example an inversion RF pulse which is known to those skilled in the art and is generated, for example 100 ms before the excitation RF pulse 301.

A third version of the method according to the invention, used to form an image of, for example the CSF flow in the aqueduct of Sylvius in the body to be examined, will be described in detail hereinafter with reference to FIG. 4. In this version the pulse sequence described with reference to FIG. 3 is combined with a known Echo Planar Imaging (EPI) imaging pulse sequence. The EPI imaging pulse sequence is known, for example from the cited handbook "Magnetic Resonance Imaging" by M. T. Vlaardingerbroek, Springer-Verlag, 1996, pp. 123–125. It is alternatively possible to combine the EPI imaging pulse sequence with the pulse sequence described with reference to FIG. 2. The latter combination will not be elucidated further in the present patent application.

Figure 4:
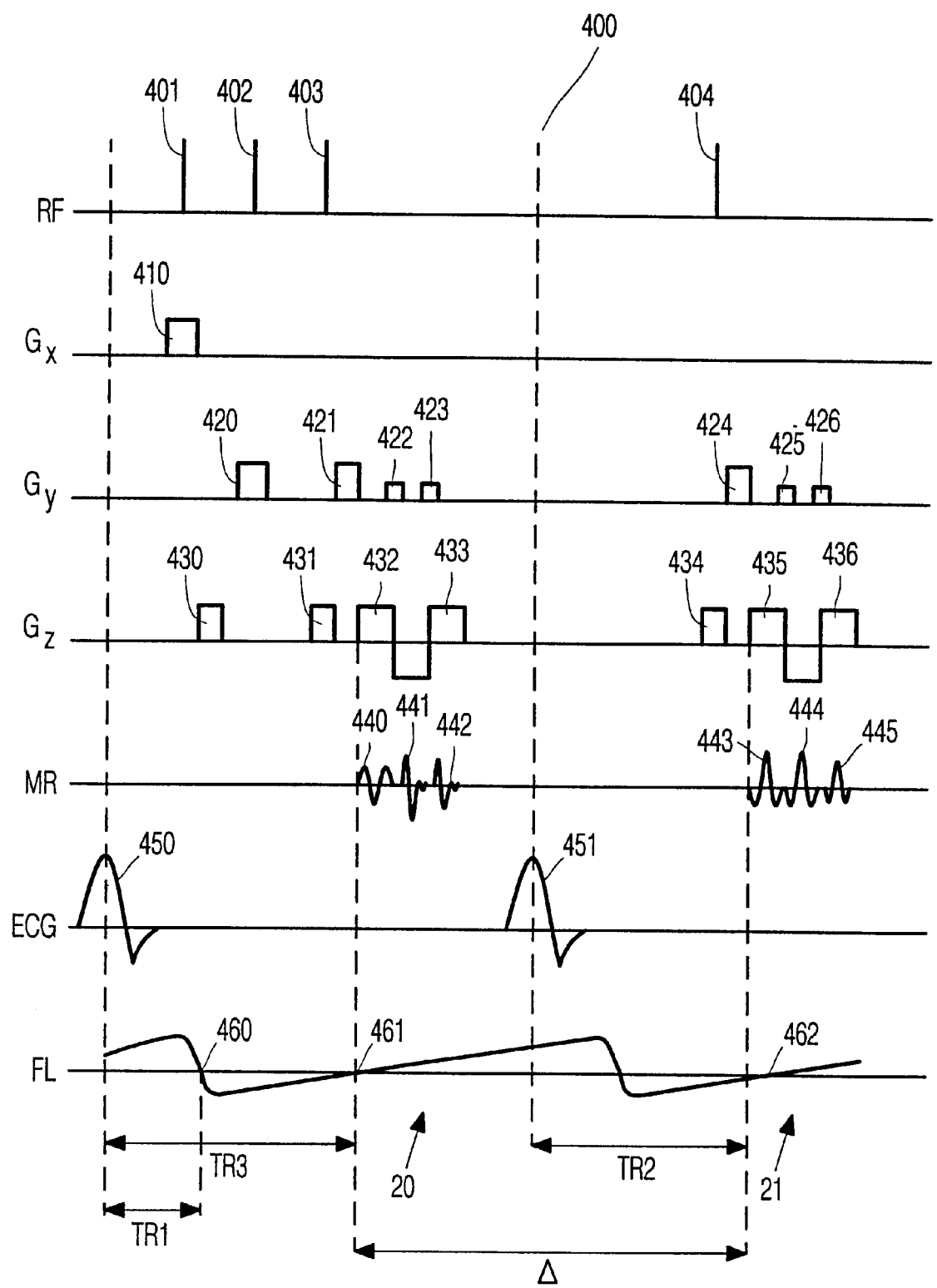
FIG. 4 shows an example of an imaging pulse sequence according to the invention.

The upper row in FIG. 4, denoted by the reference RF, shows the RF pulses to be generated; the three rows situated therebelow, denoted by the references $G_x$, $G_y$, $G_z$, show the gradients in the x, y and z directions, respectively. The row situated therebelow, denoted by the reference MR, shows the MR signals to be measured. Furthermore, the lowermost two rows, denoted by the references ECG and FL, show a number of periods of an ECG to be recorded for the body to be examined and the velocity of the varying fluid flow as a function of the heart beat.

The imaging pulse sequence shown in FIG. 4 contains an excitation RF pulse 401, first and second additional gradients 430, 431, first, second and third additional RF pulses 402–404, selection gradients 410, phase encoding gradients 420–426, and read-out gradients 431–433, 434–436.

For in vivo measurement of a displacement of the fluid in the aqueduct of Sylvius in the brain of the body to be examined, the pulse sequence is applied after the occurrence of an R wave of the ECG to be recorded. The pulse sequence starts by generating the excitation RF pulse 401, applying a first gradient 410 in the x direction, and applying the first additional gradient and generating the first additional RF pulse 402, the first additional gradient being applied after a first trigger period TR1. The first trigger period TR1 determines a phase in a first period 20 of the periodic CSF flow, preferably a first zero crossing 460 of the flow velocity in the periodic fluid flow. The excitation RF pulse 401 directs the magnetization in the fluid flow in a transverse plane relative to the direction of the steady magnetic field.

Subsequently, phase encoding is applied by application of the first additional gradient 430, preferably during the first zero crossing 461 in the flow velocity, said first additional gradient being directed in the z direction. The excitation RF pulse 401 has an angle of rotation α which amounts to, for example 90 degrees. The first additional RF pulse 402 directs the magnetization of a measuring volume of the CSF flow in the direction of the steady magnetic field. The first additional RF pulse 402 preferably has an angle of rotation α preferably amounting to 10 degrees.

Subsequently, two RF pulses are generated, i.e. the second additional RF pulse 403 in the first period 20 and the third additional RF pulse 404 in the second period 21. The angles of rotation of the second and the third additional RF pulse both preferably amount to 10 degrees. The second additional RF pulse 403 directs a first part of the reference magnetization in the transverse plane again.

Subsequently, the second additional gradient 432 is applied, preferably during a second zero-crossing 461, said second additional gradient being partly coincident with the read-out gradient 433. The second additional gradient 432, having the same properties as the first additional gradient 430, dephases the part of the reference magnetization, after which a first MR signal 440 can be measured. In order to obtain an image of a two-dimensional velocity profile, subsequently a preparation phase encoding gradient 421 is applied in, for example the y direction and the first alternating read-out gradient 432, 433 is applied in the z direction, additional phase encoding gradients 422, 423 then being applied at zero crossings of the alternating read-out gradient at which the first MR signals 440–442 are measured.

Subsequently, the third additional RF pulse 404 directs a second part of the remaining reference magnetization in the transverse plane. Subsequently, the third additional gradient 435 is applied, preferably during a third zero crossing 462 in the flow velocity in the periodically varying CSF flow, said third additional gradient being partly coincident with the read-out gradient 436. The third additional gradient 435, having the same properties as the first additional gradient 430, dephases the remaining part of the reference magnetization so that the reference MR signals 443–445 can be measured. The first, the second and the third zero crossing, 460, 461, 462, respectively, are determined by determining, prior to the experiment, the interval Δ between the occurrence of successive R waves 450, 451 in the ECG signal of the body to be examined and the intervals TR1, TR2 and TR3 between the R waves 450, 451 and the respective zero crossings 460, 461, 462 in the flow velocity of the CSF flow, the flow velocity then being measured by means of the previously mentioned phase contrast MR method. This imaging pulse sequence 400 is repeated for different values of the preparation phase encoding gradient 421, so that first MR signals and reference MR signals are measured along a first number of lines in the k space which extend parallel to the $k_z$ axis. The first number of lines in the k space amounts to, for example 64.

Subsequently, using two-dimensional Fourier transformations of the measured first MR signals 440–442 and the measured reference MR signals 443–445, the image processing unit 12 reconstructs a first phase image and a reference phase image. The image of the two-dimensional flow profile, in which each pixel is dependent on the phase difference associated with the corresponding pixel of the reference phase image and the first phase image and on the properties of the applied gradients 430, 432, 435, can subsequently be determined by means of the formula (4).

All references cited herein, as well as the priority document European Patent Application 98203883.8 filed Nov. 18, 1998, are incorporated herein by reference in their entirety and for all purposes to the same extent as if each individual publication or patent or patent application was specifically and individually indicated to be incorporated by reference in its entirety for all purposes.

What is claimed is:

1. A method of measuring a periodically varying fluid flow in an object by means of magnetic resonance, which object is arranged in a steady magnetic field, said method comprising:

generating an excitation RF pulse in order to direct a reference magnetization into a transverse plane relative to the direction of the steady magnetic field, applying a first additional gradient in a flow direction of the fluid flow in order to produce a phase shift in the reference magnetization, generating a first additional RF pulse in order to direct the reference magnetization into the direction of the steady magnetic field, generating a second additional RF pulse in order to direct a part of the reference magnetization into a transverse direction relative to the direction of the steady magnetic field, applying a second additional gradient in the flow direction in order to cancel the phase shift caused by the first additional gradient in static material near the fluid flow, measuring a first MR signal, and determining a displacement of the fluid from the measured first MR signal and a reference MR signal, wherein, near a phase of a first period of the periodically a, varying fluid flow, the excitation RF pulse is generated, the first additional gradient is applied and the first additional RF pulse is generated, and, near a corresponding phase of a second period of the periodically varying fluid flow, the second additional RF pulse is generated, the second additional gradient is applied and the first MR signal is measured.

2. A method as claimed in claim 1 wherein the phase of the first period of the periodic fluid flow corresponds to a zero crossing of a flow velocity of the periodic fluid flow.

3. A method as claimed in claim 1 further comprising determining the reference MR signal by near a corresponding phase of a further third period of the periodically varying fluid flow, generating the excitation RF pulse, applying the first additional gradient, and generating the first additional RF pulse, and near a corresponding phase of a further fourth period of the periodically varying fluid flow, generating the second additional RF pulse, applying the second additional gradient, and measuring the reference MR signal, wherein a time integral of the first additional gradient applied in the third period is different from a corresponding time integral of the first additional gradient applied in the first period.

4. A method as claimed in claim 1 further comprising determining the reference MR signal generating a third additional RF pulse near a corresponding phase of a next period of the periodic fluid flow, applying a third additional gradient which has the same properties as the second additional gradient, and measuring the reference MR signal.

5. A method as claimed in claim 1, in which the fluid flow varies with a period which corresponds to a period of a cardiac cycle of a human or animal to be examined, and wherein the method further comprises measuring an ECG of the human or animal to be examined, and determining a reference from the measured ECG which corresponds to the phase in the period of the periodically varying fluid flow.

6. A method as claimed in claim 5 further comprising determining a zero crossing of the flow velocity of the periodically varying fluid flow by measurement of a flow velocity of the periodically varying fluid flow, and wherein the reference also corresponds to the zero crossing of the flow velocity of the periodically varying fluid flow.

7. A method of forming a two-dimensional velocity profile of a periodically varying fluid flow in an object by means of magnetic resonance, which object is arranged in a steady magnetic field, said method comprising:

generating an excitation RF pulse in order to direct a reference magnetization into a transverse plane relative to the direction of the steady magnetic field, applying a first additional gradient in a flow direction of the fluid flow in order to produce a phase shift in the reference magnetization, generating a first additional RF pulse in order to direct the reference magnetization into the direction of the steady magnetic field, generating a second additional RF pulse in order to direct a part of the reference magnetization into a transverse direction relative to the direction of the steady magnetic field, applying a second additional gradient in the flow direction in order to cancel the phase shift caused by the first additional gradient in static material near the fluid flow, measuring first MR signals, determining a phase image from the measured first MR signals, and determining the two-dimensional velocity profile of the fluid from the phase image and a reference phase image, wherein near a phase of a first period of the periodically varying fluid flow, the excitation RF pulse is generated, the first additional gradient is applied and the first additional RF pulse is generated, and, near a corresponding phase of a second period of the periodically varying fluid flow, the second additional RF pulse is generated, the second additional gradient is applied and the first MR signal is measured.

8. A device for measuring a periodically varying fluid flow in an object to be examined by means of magnetic resonance, which object is arranged in a steady magnetic field, said device comprising:

means for sustaining a steady magnetic field, means for applying gradients, means for generating RF pulses to be applied to the object to be examined in the steady magnetic field, a control unit for controlling the application of gradients and the generating of RF pulses, and means for receiving and sampling magnetic resonance signals which are generated by pulse sequences containing the RF pulses and the gradients, wherein said control unit is arranged to generate an excitation RF pulse in order to direct a reference magnetization into a plane which extends transversely to the direction of the steady magnetic field, apply a first additional magnetic field gradient in a flow direction of the fluid flow in order to produce a phase shift in the reference magnetization, generate a first additional RF pulse in order to direct the reference magnetization into the direction of the steady magnetic field, generate a second additional RF pulse in order to direct a part of the reference magnetization into a transverse direction relative to the direction of the steady magnetic field, apply a second additional magnetic field gradient in the flow direction in order to cancel the phase shift caused by the first additional gradient, measure a first MR signal, and determine a displacement of the fluid from the measured first MR signal and a reference signal, wherein the control unit is further arranged so that, near a phase of a first period of the periodically varying fluid flow, the excitation RF pulse is generated, the first additional gradient is applied and the first additional RF pulse is generated, and, near a corresponding phase of a second period of the periodically varying fluid flow, the second additional RF pulse is generated, the second additional gradient is applied and the first MR signal is measured.

* * * * *